United States Patent
Chen

(10) Patent No.: US 10,672,492 B2
(45) Date of Patent: Jun. 2, 2020

(54) DATA SAMPLING CIRCUIT MODULE, DATA SAMPLING METHOD AND MEMORY STORAGE DEVICE

(71) Applicant: PHISON ELECTRONICS CORP., Miaoli (TW)

(72) Inventor: Chih-Ming Chen, Hsinchu County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 153 days.

(21) Appl. No.: 14/640,032

(22) Filed: Mar. 6, 2015

(65) Prior Publication Data
US 2016/0189785 A1  Jun. 30, 2016

(30) Foreign Application Priority Data

Dec. 27, 2014  (TW) .............................. 103145950 A

(51) Int. Cl.
| | | |
|---|---|---|
| G06F 12/02 | (2006.01) | |
| G11C 27/02 | (2006.01) | |
| H04L 25/49 | (2006.01) | |
| H04L 25/08 | (2006.01) | |
| H04L 25/00 | (2006.01) | |

(52) U.S. Cl.
CPC .............. *G11C 27/02* (2013.01); *H04L 25/00* (2013.01); *H04L 25/085* (2013.01); *H04L 25/49* (2013.01); *H04L 25/4902* (2013.01)

(58) Field of Classification Search
None
See application file for complete search history.

(56) References Cited

U.S. PATENT DOCUMENTS

| | | | | |
|---|---|---|---|---|
| 5,574,456 A | * | 11/1996 | Cho | H03M 1/504 341/110 |
| 8,464,135 B2 | | 6/2013 | Erez et al. | |
| 9,680,493 B1 | * | 6/2017 | Pritsker | H03M 1/0629 |
| 2002/0101264 A1 | * | 8/2002 | Natsume | H04L 7/0338 327/91 |
| 2007/0043797 A1 | * | 2/2007 | Luzzi | G06F 7/588 708/250 |
| 2008/0273628 A1 | * | 11/2008 | Kurata | G08C 23/04 375/340 |
| 2014/0126656 A1 | * | 5/2014 | Chung | H04L 7/0331 375/259 |

FOREIGN PATENT DOCUMENTS

| | | |
|---|---|---|
| CN | 102510328 | 6/2012 |
| TW | 200847636 | 12/2008 |

OTHER PUBLICATIONS

"Office Action of Taiwan Counterpart Application", dated Apr. 22, 2016, p. 1-p. 4, in which the listed references were cited.

* cited by examiner

*Primary Examiner* — Charles Rones
*Assistant Examiner* — Ryan Dare
(74) *Attorney, Agent, or Firm* — JCIPRNET

(57) ABSTRACT

A data sampling circuit module, a data sampling method and a memory storage device are provided. The method includes: receiving a differential signal and generating an input data stream according to the differential signal; sampling a clock signal according to a plurality of turning points of the input data stream and outputting a sampling signal; and outputting a bit data stream corresponding to the input data stream according to the sampling signal.

32 Claims, 8 Drawing Sheets

DATA SAMPLING CIRCUIT MODULE, DATA SAMPLING METHOD AND MEMORY STORAGE DEVICE

CROSS-REFERENCE TO RELATED APPLICATION

This application claims the priority benefit of Taiwan application serial no. 103145950, filed on Dec. 27, 2014. The entirety of the above-mentioned patent application is hereby incorporated by reference herein and made a part of this specification.

BACKGROUND

Technology Field

The disclosure relates to a data sampling circuit module, more particularly, to a data sampling circuit module, a data sampling method, and a memory storage device.

Description of Related Art

In general, some signals are transmitted in a form of differential signal in order to reduce power consumption. After a receiving end device receives a set of differential signals, the set of differential signals are recovered as a data stream. The data stream is composed of a series of pulses, and waveforms of the pulses are related to bit data to be transmitted. For example, a certain type of waveform represents a transmission bit data "1", and another type of waveform represents a transmission bit data "0".

Conventionally, in order to identify a waveform of each pulse in the data stream, the receiving end device samples the data stream in a great amount through a clock signal which has a very high clock frequency and re-builds the waveform of the pulse of the data stream through analyzing whether the sampled signal falls in a logic high or a logic low. However, such sampling method requires adoptions of clock signal having very high frequency, which consumes more power for the system and has poor efficiency.

Nothing herein should be construed as an admission of knowledge in the prior art of any portion of the present disclosure. Furthermore, citation or identification of any document in this application is not an admission that such document is available as prior art to the present disclosure, or that any reference forms a part of the common general knowledge in the art.

SUMMARY

The disclosure provides a data sampling circuit module, a data sampling method, and a memory storage device, which may effectively increase efficiency of processing the received differential signal.

An exemplary embodiment of the disclosure provides a data sampling circuit module, which includes a differential signal converting circuit, a sampling circuit, and a bit data outputting circuit. The differential signal converting circuit is configured to receive a differential signal and generating an input data stream according to the differential signal. The sampling circuit is coupled to the differential signal converting circuit, wherein the sampling circuit is configured to sample a clock signal according to a plurality of turning points of the input data stream and output a sampling signal. The bit data outputting circuit is coupled to the sampling circuit and configured to output a bit data stream corresponding to the input data stream according to the sampling signal.

Another exemplary embodiment of the disclosure provides a data sampling method, which includes: receiving a differential signal and generating an input data stream according to the differential signal; sampling a clock signal according to a plurality of turning points of the input data stream and outputting a sampling signal; and outputting a bit data stream corresponding to the input data stream according to the sampling signal.

Another exemplary embodiment of the disclosure provides a memory storage device, which includes a connection interface unit, a rewritable non-volatile memory module, and a memory controlling circuit unit. The connection interface unit is configured to couple to a host system. The rewritable non-volatile memory module includes a plurality of physical erasing units. The memory controlling circuit unit is coupled to the connection interface unit and the rewritable non-volatile memory module. The connection interface unit includes a data sampling circuit module. The data sampling circuit module includes a differential signal converting circuit, a sampling circuit, and a bit data outputting circuit. The differential signal converting circuit is configured to receive a differential signal and generating an input data stream according to the differential signal. The sampling circuit is coupled to the differential signal converting circuit, wherein the sampling circuit is configured to sample a clock signal according to a plurality of turning points of the input data stream and outputting a sampling signal. The bit data outputting circuit is coupled to the sampling circuit and configured to output a bit data stream corresponding to the input data stream according to the sampling signal.

In view of the above, after a received differential signal is converted into an input data stream, the disclosure may sample a clock signal according to a plurality of turning points of the input data stream and generate a bit data stream corresponding to the input data stream according to the sampled sampling signal. Accordingly, efficiency of processing the received differential signal may be effectively improved.

It should be understood, however, that this Summary may not contain all of the aspects and embodiments of the present disclosure, is not meant to be limiting or restrictive in any manner, and that the disclosure as disclosed herein is and will be understood by those of ordinary skill in the art to encompass obvious improvements and modifications thereto.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
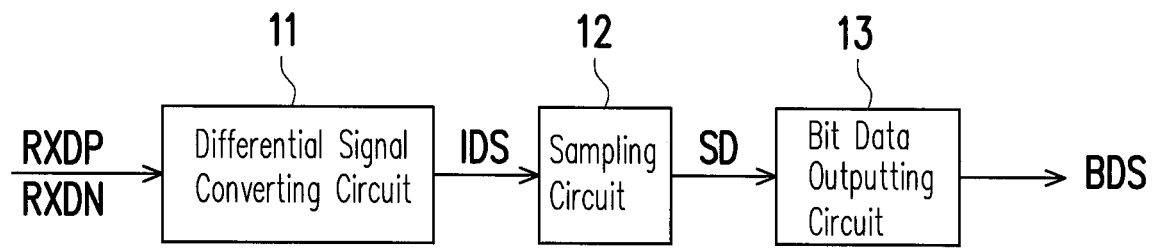
FIG. 1 is a schematic view illustrating a data sampling circuit module according to an exemplary embodiment of the disclosure.

Reference will now be made in detail to the present embodiments of the disclosure, examples of which are illustrated in the accompanying drawings. Wherever possible, the same reference numbers are used in the drawings and the description to refer to the same or like parts.

A plurality of exemplary embodiments are provided below to describe the disclosure, though the disclosure is not limited to the provided exemplary embodiments, and the exemplary embodiments can also be suitably combined. A term "couple" used in the full text of the disclosure (including the claims) refers to any direct and indirect connections. For example, if a first device is described to be coupled to a second device, it is interpreted as that the first device is directly coupled to the second device, or the first device is indirectly coupled to the second device through other devices or connection means. Moreover, a term "signal" refers to at least a current, a voltage, an electric charge, a temperature, data or any other one or a plurality of signals.

Embodiments of the present disclosure may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

FIG. 1 is a schematic view illustrating a data sampling circuit module according to an exemplary embodiment of the disclosure.

With reference to FIG. 1, a data sampling circuit module 10 includes a differential signal converting circuit 11, a sampling circuit 12, and a bit data outputting circuit 13.

The differential signal converting circuit 11 is configured to receive differential signals RXDP and RXDN and generate an input data stream IDS according to the differential signals RXDP and RXDN. The differential signals RXDP and RXDN modulate signals are pulse width modulation signals generated by using pulse width modulation (PWM) technology. The differential signals RXDP and RXDN have the same amplitudes, and the differential signals RXDP and RXDN have opposite phases. In the present exemplary embodiment, the differential signal converting circuit 11 converts the analog differential signals RXDP and RXDN into the digital input data stream IDS.

Figure 2:
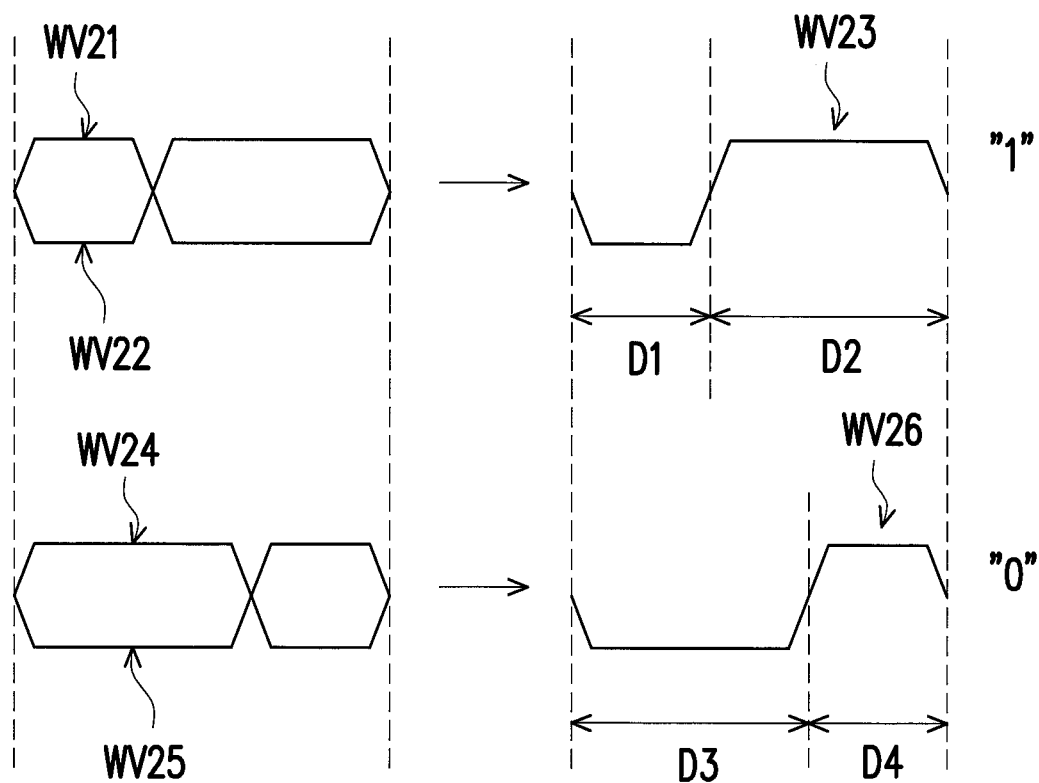
FIG. 2 is a schematic view illustrating a generation of an input data stream according to an exemplary embodiment of the disclosure.

FIG. 2 is a schematic view illustrating a generation of an input data stream according to an exemplary embodiment of the disclosure.

With reference to FIG. 2, if a pulse WV21 of the differential signal RXDP and a pulse WV22 of the differential signal RXDN are received, the differential signal converting circuit 11 converts the pulses WV21 and WV22 into a pulse WV23 of the input data stream IDS. The length of each of the pulses WV21 to WV23 conforms to a clock cycle, and in the pulse WV23, a logic low interval D1 is longer than a logic high interval D2. In addition, if a pulse WV24 of the differential signal RXDP and a pulse WV25 of the differential signal RXDN are received, the differential signal converting circuit 11 converts the pulses WV24 and WV25 into a pulse WV26 of the input data stream IDS. The length of each of the pulses WV24 to WV26 conforms to a clock cycle, and in the pulse WV26, a logic low interval D3 is shorter than a logic high interval D4.

In the present exemplary embodiment, the pulses WV23 and WV26 are used for representing different types of bit data. For example, the pulse WV23 represents a bit data "1" and the pulse WV26 represents a bit data "0". The data sampling circuit module 10 may need to identify the pulses WV23 and WV26 of the input data stream IDS to output corresponding bit data. In another exemplary embodiment, the pulse WV23 may also represent the bit data "0" and the pulse WV26 may also represent the bit data "1". In addition, in another exemplary embodiment, pulses having different waveforms of the input data stream IDS may also be used for representing any two bit data in different types and with unrestricted bit numbers. The data sampling circuit module 10 outputs corresponding bit data according to the input data stream IDS.

The sampling circuit 12 is coupled to the differential signal converting circuit 11. The sampling circuit 12 is configured to sample a clock signal according to a plurality of turning points of the input data stream IDS and output a sampling signal SD. Here, a turning point refers to a point where a pulse is converted into a logic low from a logic high or converted into a logic high from a logic low; while a clock signal is, for example, an inner clock signal which is self-generated by the data sampling circuit module 10 or a clock signal which is provided by an electronic device (e.g., a memory storage device or a memory controlling circuit unit) which employs the data sampling circuit module 10. A clock frequency of the clock signal is higher than a clock frequency of the input data stream IDS. For example, the clock frequency of the clock signal may be five to six times the clock frequency of the input data stream IDS. For example, assuming a clock frequency of a pulse as illustrated in FIG. 2 is 72 Mega Hertz (MHz), then the clock frequency of the clock signal may be, for example, 360 to 432 MHz. However, the clock frequency of the clock signal may also be higher or lower, and a relationship between the clock frequency of the clock signal and the clock frequency of the input data stream IDS may also be adjusted according to practical needs. The disclosure is not limited thereto. In addition, the sampling signal SD is used to indicate a time relationship of the sampled turning points.

The bit data outputting circuit 13 is coupled to the sampling circuit 12. The bit data outputting circuit 13 is configured to output a bit data stream BDS corresponding to the input data stream IDS according to the sampling signal SD. For example, the bit data outputting circuit 13 obtains a time relationship of the plurality of turning points of the input data stream IDS according to the sampling signal SD, determines a waveform of each pulse of the input data stream IDS and a data bit represented thereof according to the time relationship, and outputs the corresponding data bit stream BDS accordingly.

Figure 3:
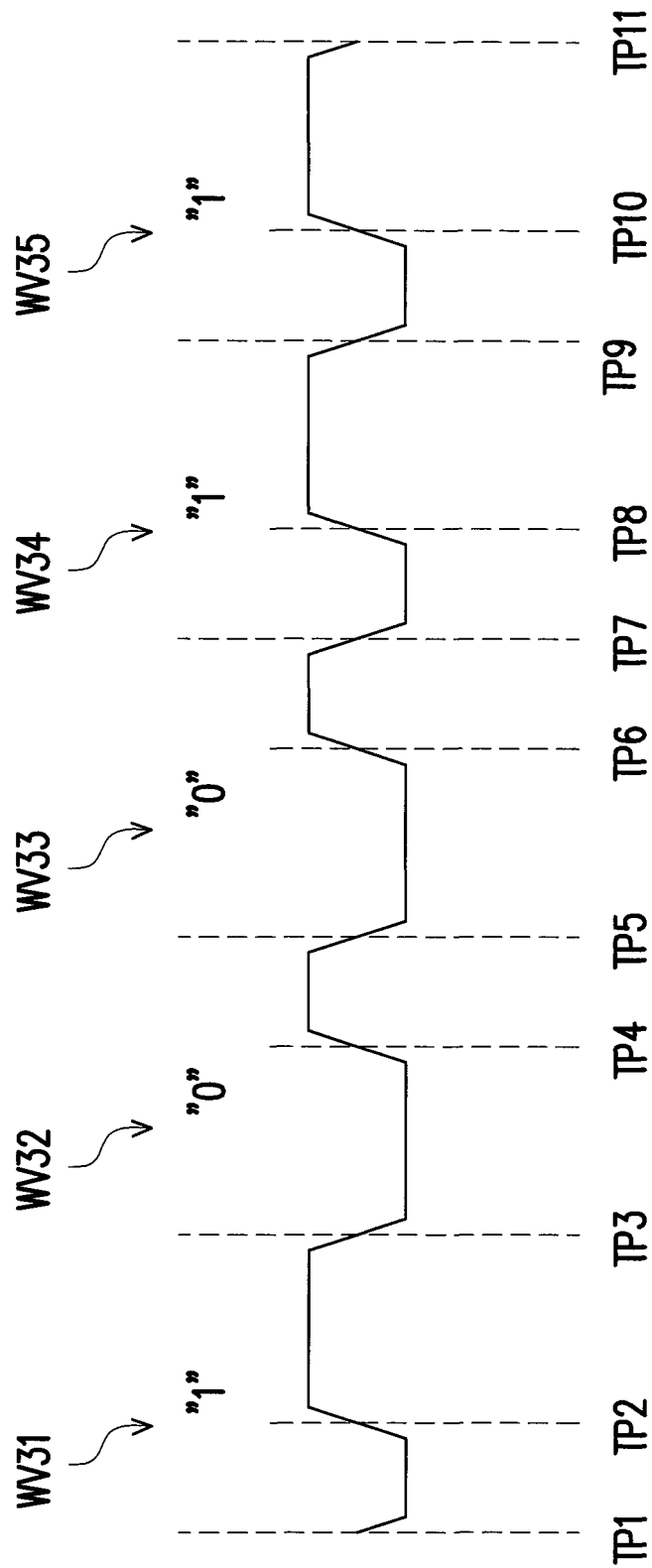
FIG. 3 is a schematic view illustrating an input data stream according to an exemplary embodiment of the disclosure.

FIG. 3 is a schematic view illustrating an input data stream according to an exemplary embodiment of the disclosure.

With reference to FIG. 3, assuming the input data stream IDS includes pulses WV31 to WV35 which represent bit data "1," "0," "0," "1" and "1" (where each pulse is divided by one clock cycle), the sampling circuit 12 samples a clock signal according to turning points TP1 to TP11 and outputs the corresponding sampling signal SD. The bit data outputting circuit 13 may identify that a waveform of each of the pulses WV31 to WV35 belongs to a waveform of the pulse WV23 or the pulse WV26 depicted in FIG. 2 according to the sampling signal SD and output the corresponding bit data stream BDS accordingly.

Taking the pulse WV31 as an example, the sampling circuit 12 samples a clock signal according to the turning points TP1, TP2 and TP3 which belong to the same clock cycle. The turning points TP1 and TP3 are points where the pulse WV31 is converted into a logic low from a logic high, respectively, and the turning point TP2 is a point where the pulse WV31 is converted into a logic high from a logic low. In other words, the turning points TP1 and TP3 belong to failing edges of the pulse WV31, and the turning point TP2 belongs to a raising edge of the pulse WV31. According to the sampled clock signal, the sampling circuit 12 outputs the corresponding sampling signal SD. Here, the sampling signal SD may be used to indicate a time relationship of the turning points TP1, TP2 and TP3. For example, the sampling signal SD may indicate a time difference of the turning points TP1 and TP2, a time difference of the turning points TP1 and TP3, and/or a time difference of the turning points TP2 and TP3. According to the sampling signal SD, the bit data outputting circuit 13 may obtain that the time difference of the turning points TP1 and TP2 is less than the time difference of the turning points TP2 and TP3 (i.e., the waveform of the pulse WV31 belongs to the waveform of the pulse WV23 depicted in FIG. 2), thereby determining that the pulse WV31 represents the bit data "1".

Taking the pulse WV32 as another example, the sampling circuit 12 samples a clock signal according to the turning points TP3, TP4 and TP5 which belong to the same clock cycle. The turning points TP3 and TP5 are points where the pulse WV32 is converted into a logic low from a logic high, respectively, and the turning point TP4 is a point where the pulse WV32 is converted into a logic high from a logic low. In other words, the turning points TP3 and TP5 belong to failing edges of the pulse WV32, and the turning point TP4 belongs to a raising edge of the pulse WV32. According to the sampled clock signal, the sampling circuit 12 outputs the corresponding sampling signal SD. Here, the sampling signal SD may be used to indicate a time relationship of the turning points TP3, TP4 and TP5. For example, the sampling signal SD may indicate a time difference of the turning points TP3 and TP4, a time difference of the turning points TP3 and TP5, and/or a time difference of the turning points TP4 and TP5. According to the sampling signal SD, the bit data outputting circuit 13 may obtain that the time difference of the turning points TP3 and TP4 is greater than the time difference of the turning points TP4 and TP5 (i.e., the waveform of the pulse WV32 belongs to the waveform of the pulse WV26 depicted in FIG. 2), thereby determining that the pulse WV32 represents the bit data "0". The above operations of identifying the waveforms of the pulses WV31 and WV32 may be applied to identify the pulses WV33 to WV35, and descriptions thereof are not reiterated herein.

It is worth to note that the above exemplary embodiments indicate time relationships of turning points by using time differences of the turning points. However, in another exemplary embodiment, a time relationship of turning points may also be represented by means of distances between the turning points, conversion frequencies or conversion times between logic highs and logic lows of a signal, which are not limited by the disclosure. In addition, in another exemplary embodiment, if the phases of the input data stream IDS are reversed, then the turning points TP1 and TP3 would be converted into belonging to the raising edges of the pulse of WV31, and the turning point TP2 would be converted into belonging to the failing edge of the pulse of WV31, and the other turning points TP4 to TP11 may be deduced accordingly.

Figure 4:
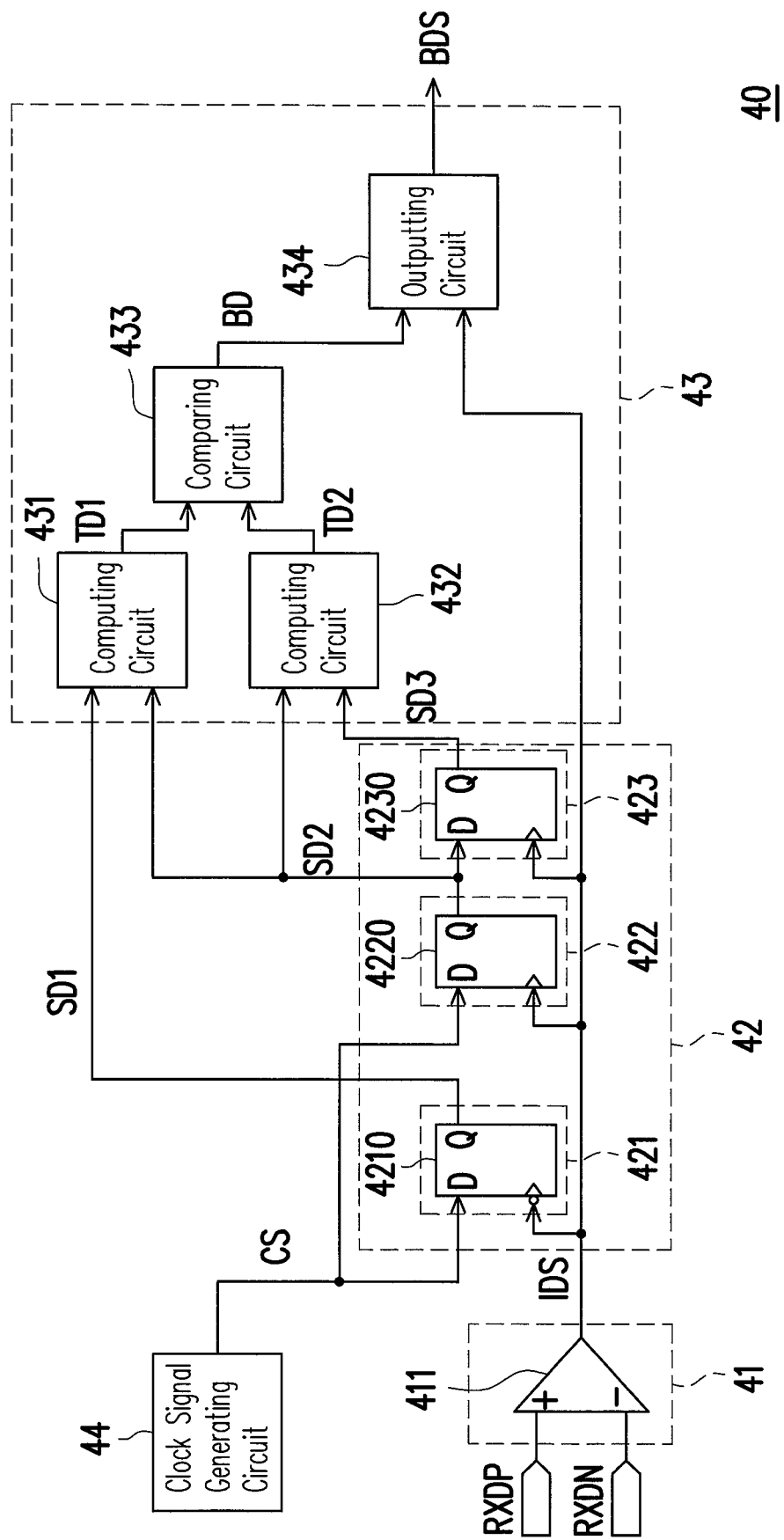
FIG. 4 is a schematic view illustrating a data sampling circuit module according to an exemplary embodiment of the disclosure.

FIG. 4 is a schematic view illustrating a data sampling circuit module according to an exemplary embodiment of the disclosure.

With reference to FIG. 4, a data sampling circuit module 40 includes a differential signal converting circuit 41, a sampling circuit 42, a bit data outputting circuit 43, and a clock signal generating circuit 44. The clock signal generating circuit 44 is configured to provide a clock signal CS. For example, the clock signal generating circuit 44 includes an oscillator.

The differential signal converting circuit 41 includes a differential amplifier 411. The differential amplifier 411 is configured to receive the differential signals RXDP and RXDN and perform differential amplification according to the differential signals RXDP and RXDN to generate the input data stream IDS.

The sampling circuit 42 includes sampling circuits 421 to 423. The sampling circuits 421 to 423 are configured to receive the input data stream IDS. The sampling circuits 421 to 423 sample the clock signal CS according to the plurality of turning points of the input data stream IDS and output sampling signals SD1 to SD3, respectively. When analyzing a pulse which belongs to the same clock cycle of the input data stream IDS, the sampling signals SD1 to SD3 are used for indicating a time relationship of three turning points (e.g., the turning points TP1 to TP3 depicted in FIG. 3) of the pulse. In the present exemplary embodiment, SD1 to SD3 are located sequentially. Namely, in the present exemplary embodiment, the sampled turning points (e.g., the turning points TP1 to TP3) are continuous. However, in another exemplary embodiment, the turning points to be sampled may also be dispersed.

In the present exemplary embodiment, the sampling circuit 421 includes a D-type flip-flop 4210, the sampling circuit 422 includes a D-type flip-flop 4220, and the sampling circuit 423 includes a D-type flip-flop 4230. Since the D-type flip-flops 4210 to 4230 samples the clock signal CS based on a positive edge (i.e., a raising edge) triggering of the input data stream IDS, the input data stream IDS passes through an inverter or a NOT gate element to perform a phase reversal before the input data stream IDS is inputted to the D-type flip-flop 4210. Accordingly, when analyzing the pulse WV31 depicted in FIG. 3, the sampling circuit 422 samples the clock signal CS according to the turning point TP1, the sampling circuit 421 samples the clock signal CS according to the turning point TP2, and the sampling circuit 423 samples the clock signal CS according to the turning point TP3.

The bit data outputting circuit 43 includes a computing circuit 431, a computing circuit 432, a comparing circuit 433 and an outputting circuit 434. The computing circuit 431 and the computing circuit 432 may also be implemented as the same circuit or more circuits, and the disclosure is not limited thereto. The computing circuit 431 and the computing circuit 432 are configured to obtain the relationship of the plurality of turning points of the input data stream IDS according to the sampling signals SD1 to SD3. The comparing circuit 433 is configured to determining a waveform of each pulse of the input data stream IDS and a data bit represented thereof according to the relationship. The outputting circuit 434 is configured to output the corresponding bit data stream BDS according to the bit data which is outputted by the comparing circuit 433. The following further describes the bit data outputting circuit 43 according to the exemplary embodiment of FIG. 4.

The computing circuit 431 is coupled to the sampling circuits 421 and 422 and configured to receive the sampling signals SD1 and SD2. The computing circuit 431 performs calculations according to the sampling signals SD1 and SD2 and outputs a time difference TD1 of two turning points indicated by the sampling signals SD1 and SD2. For example, in the present exemplary embodiment, when the pulse WV31 depicted in FIG. 3 is analyzed, the time difference TD1 is the time difference of the turning points TP1 and TP2.

The computing circuit 432 is coupled to the sampling circuits 422 and 423 and configured to receive the sampling signals SD2 and SD3. The computing circuit 431 performs calculations according to the sampling signals SD2 and SD3 and outputs a time difference TD2 of two turning points indicated by the sampling signals SD2 and SD3. For example, in the present exemplary embodiment, when the pulse WV31 depicted in FIG. 3 is analyzed, the time difference TD2 is the time difference of the turning points TP1 and TP3.

The comparing circuit 433 is coupled to the computing circuits 431 and 432. The comparing circuit 433 is configured to receive the time differences TD1 and TD2 and compare the time difference TD1 with a threshold value. According to a comparison result of the time difference TD1 and the threshold value, the comparing circuit 433 determines a corresponding bit data BD. In the present exemplary embodiment, the comparing circuit 433 regards half of the time difference TD2 as the threshold value. Accordingly, when analyzing the input data stream IDS depicted in FIG. 3, the comparing circuit 433 determines whether the time difference TD1 is longer than the half of the time difference TD2. If the difference TD1 is longer than the half of the time difference TD2, the comparing circuit 433 determines to output the bit data "0". If the difference TD1 is not longer than (e.g., shorter than or equal to) the half of the time difference TD2, then the comparing circuit 433 determines to output the bit data "1". The above operations of obtaining the time differences TD1 and TD2, comparing the time difference TD1 with a threshold value, and determining a corresponding bit data accordingly are performed repeatedly, until every pulse of the input data stream IDS is analyzed. For example, the bit data "1," "0," "0," "1" and "1" would be determined and outputted in correspondence with the input data stream IDS depicted in FIG. 3.

The outputting circuit 434 is coupled to the differential signal converting circuits 41 and the comparing circuit 433 and configured to receive the input data stream IDS and the bit data BD. The outputting circuit 434 outputs the bit data stream BDS according to the input data stream IDS and the bit data BD. Specifically speaking, the outputting circuit 434 samples the received bit data BD according to a clock of the input data stream IDS to output the bit data stream BDS. The above operation of sampling the bit data BD according to the clock of the input data stream IDS is similar to operation of aligning the bit data BD received by the outputting circuit 434 with the clock of the input data stream IDS.

It should be noted that FIG. 4 is only one of exemplary embodiments of the disclosure. The disclosure does not limit the layout of the sampling circuit to be the layout of the sampling circuit 42 depicted in FIG. 4. If coupling means and/or internal circuit designs of the sampling circuits 421 to 423 are changed, then the above turning points sampled by the sampling circuits 421 to 423 may change. Besides, the determination operation performed by the comparing circuit 433 may also change correspondingly.

Figure 5:
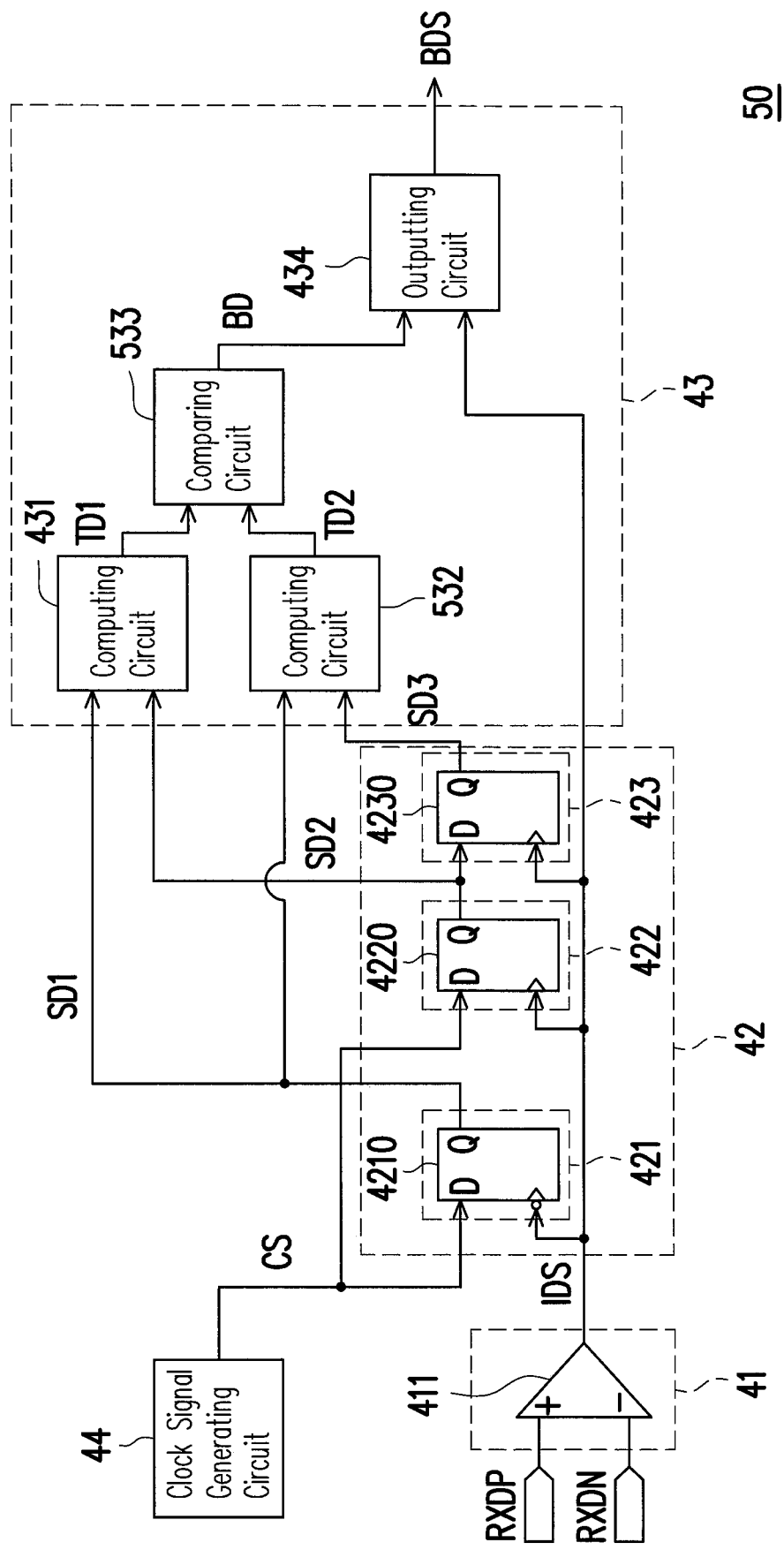
FIG. 5 is a schematic view illustrating a data sampling circuit module according to another exemplary embodiment of the disclosure.

FIG. 5 is a schematic view illustrating a data sampling circuit module according to another exemplary embodiment of the disclosure.

With reference to FIG. 5, a difference between the present exemplary embodiment and the exemplary embodiment of FIG. 4 is, in the present exemplary embodiment, a computing circuit 532 is coupled to the sampling circuits 421 and 423 and configured to receive the sampling signals SD1 and SD3. The computing circuit 532 performs calculations according to the sampling signals SD1 and SD3 and outputs the time difference TD2 of two turning points indicated by the sampling signals SD1 and SD3. For example, in the present exemplary embodiment, when the pulse WV31 depicted in FIG. 3 is analyzed, the time difference TD2 is the time difference of the turning points TP2 and TP3. The comparing circuit 533 receives the time differences TD1 and TD2 and compares the time difference TD1 with a threshold value. According to a comparison result of the time difference TD1 and the threshold value, the comparing circuit 533 determines a corresponding bit data BD.

Another difference between the present exemplary embodiment and the exemplary embodiment of FIG. 4 is, in the present exemplary embodiment, the comparing circuit 533 regards the time difference TD2 as the threshold value. Accordingly, when analyzing the input data stream IDS depicted in FIG. 3, the comparing circuit 533 determines whether the time difference TD1 is longer than the time difference TD2. If the difference TD1 is longer than the time difference TD2, the comparing circuit 533 determines to output the bit data "0". If the time difference TD1 is not longer than (e.g., shorter than or equal to) the time difference TD2, then the comparing circuit 533 determines to output the bit data "1". The bit data "1," "0," "0," "1" and "1" would also be determined and outputted by the comparing circuit 533 in correspondence with the input data stream IDS depicted in FIG. 3.

It is worth to note that, although the exemplary embodiment of FIG. 5 achieves specific functions by changing the coupling means of the sampling circuit, the same or similar functions may also be achieved by changing an internal circuit structure of the sampling circuit in another exemplary embodiment. For example, in another exemplary embodiment of FIG. 4, if the inverter or the NOT gate element which is originally arranged in the sampling circuit 421 are removed and set in the sampling circuit 422, so as to perform a phase reversal of the input data stream IDS which is to be inputted into the D-type flip-flop 4220, then the same or similar functions provided by changing the coupling means of the sampling circuit may also be achieved. In addition, the circuit structures of the data sampling circuit modules depicted in FIG. 4 and FIG. 5 are merely examples, and any useful electronic element may be incorporated additionally into the data sampling circuit modules depicted in FIG. 4 and FIG. 5 so as to meet practical needs.

Figure 6:
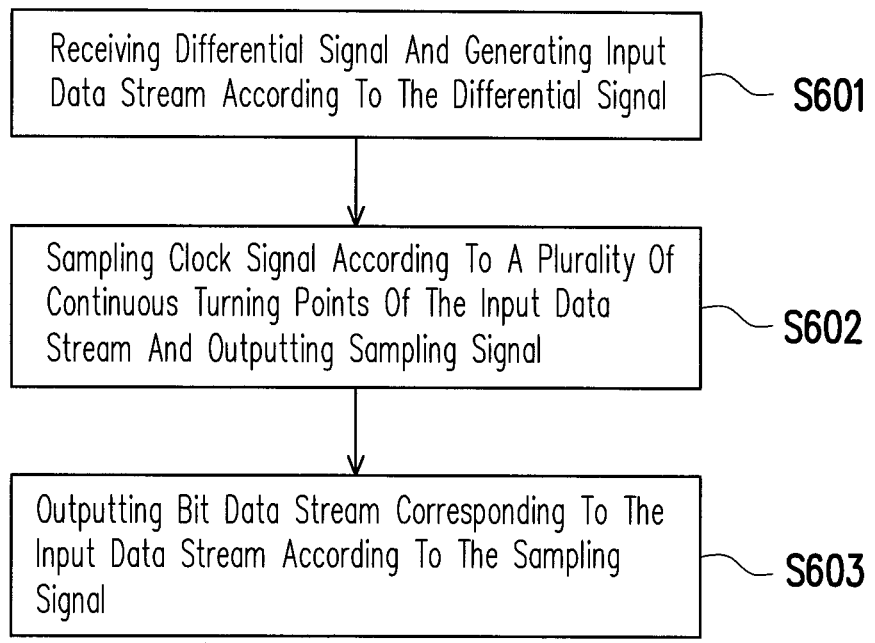
FIG. 6 is a flowchart illustrating a data sampling method according to an exemplary embodiment of the disclosure.

FIG. 6 is a flowchart illustrating a data sampling method according to an exemplary embodiment of the disclosure.

With reference to FIG. 6, in a step S601, a differential signal is received and an input data stream is generated according to the differential signal. In a step S602, a clock signal is sampled according to a plurality of turning points of the input data stream and a sampling signal is outputted. In a step S603, a bit data stream corresponding to the input data stream is outputted according to the sampling signal.

However, each step in FIG. 6 has been described in details above and is not reiterated herein. It should be noted that each step in FIG. 6 may be implemented as a plurality of program codes or circuits, and the disclosure is not limited thereto. In addition, the method in FIG. 6 may be adopted together with the above exemplary embodiments and may also be adopted alone, which is not limited by the disclosure.

In the present exemplary embodiment, the above-mentioned data sampling circuit module and the data sampling method are arranged in a memory storage device (also referred to as a memory storage system), or are arranged in and adopted for a memory controlling circuit unit for controlling a memory storage device. However, in another exemplary embodiment, the above-mentioned data sampling circuit module and the data sampling method may also be arranged in various kinds of electronic devices or communication devices such as a smartphone, a tablet PC, a notebook, and the disclosure is not limited thereto.

Generally, a memory storage device includes a rewritable non-volatile memory module and a controller (also referred to as a control circuit). The memory storage device is usually adopted together with a host system, so that the host system may write data into the memory storage device or read data from the memory storage device.

Figure 7:
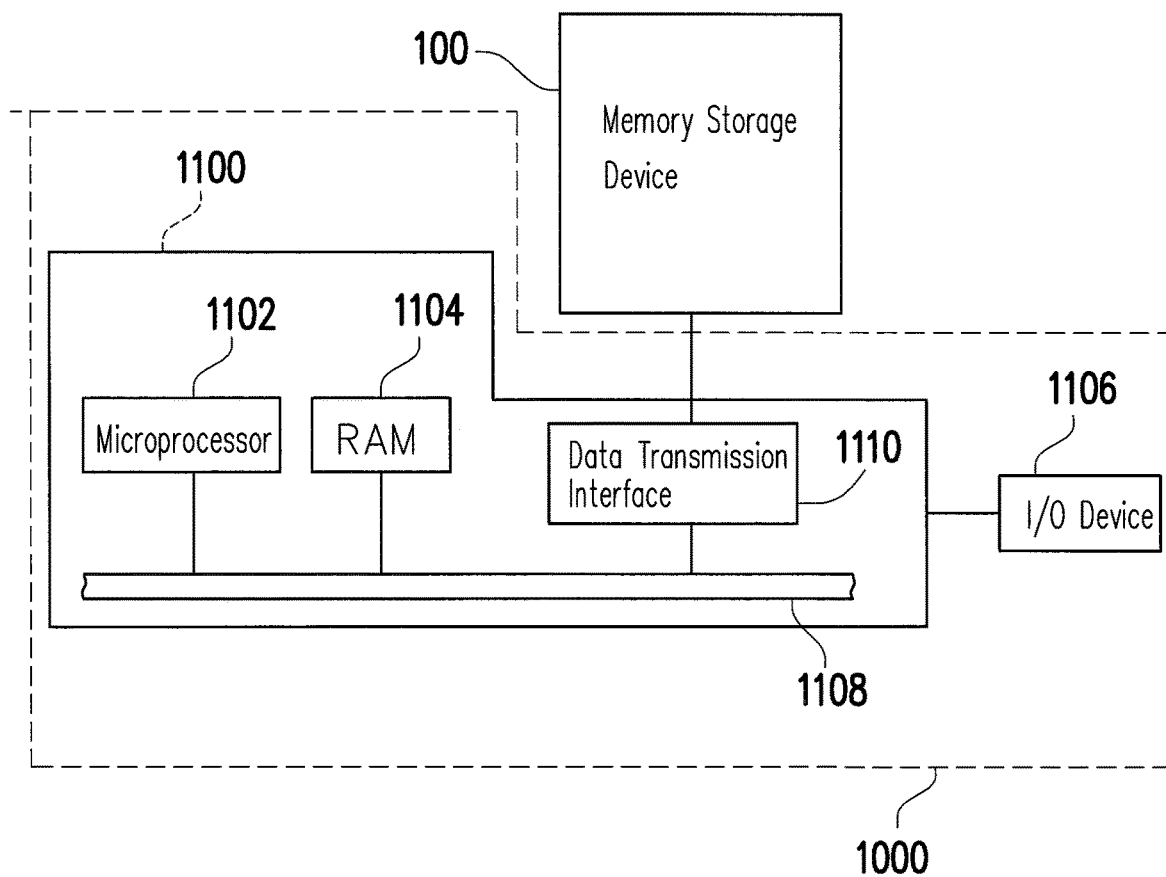
FIG. 7 is a schematic view illustrating a host system and a memory storage device according to an exemplary embodiment of the disclosure.
Figure 8:
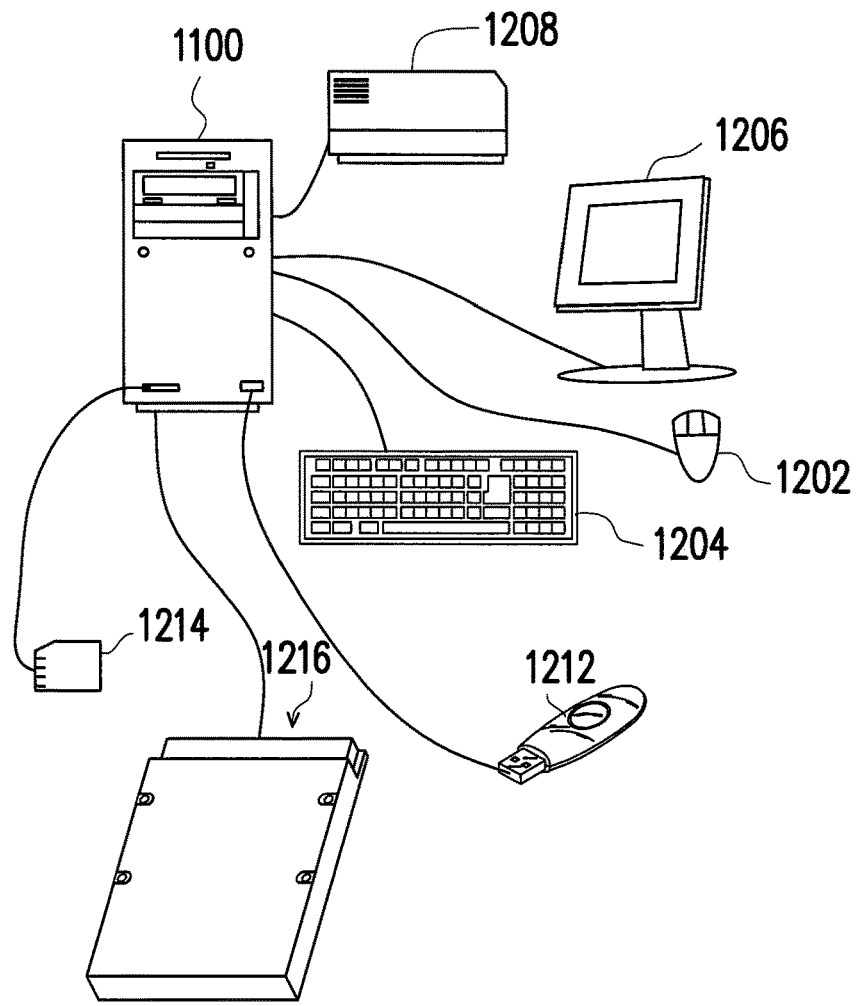
FIG. 8 is a schematic view illustrating a computer system and an input/output (I/O) device according to an exemplary embodiment of the disclosure.
Figure 9:
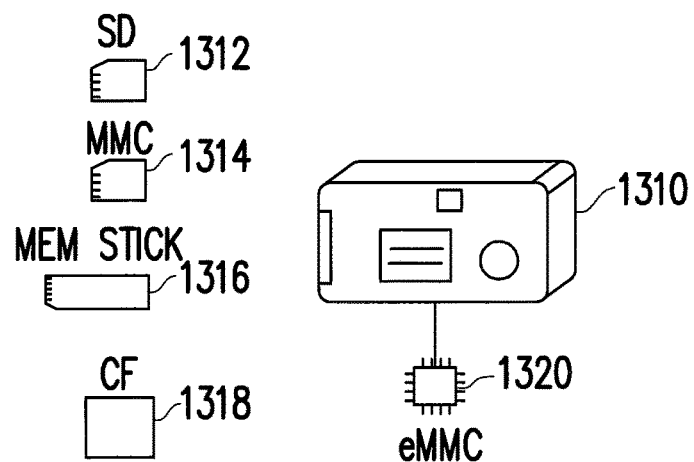
FIG. 9 is a schematic view illustrating a host system and a memory storage device according to an exemplary embodiment of the disclosure.

FIG. 7 is a schematic view illustrating a host system and a memory storage device according to an exemplary embodiment of the disclosure. FIG. 8 is a schematic view illustrating a computer system and an input/output (I/O) device according to an exemplary embodiment of the disclosure. FIG. 9 is a schematic view illustrating a host system and a memory storage device according to an exemplary embodiment of the disclosure.

With reference to FIG. 7, a host system 1000 generally includes a computer 1100 and an input/output (I/O) device 1106. The computer 1100 includes a microprocessor 1102, a random access memory (RAM) 1104, a system bus 1108, and a data transmission interface 1110. The I/O device 1106 includes a mouse 1202, a keyboard 1204, a display 1206, and a printer 1208 as shown in FIG. 8. It should be understood that the devices depicted in FIG. 8 are not intended to limit the I/O device 1106, and the I/O device 1106 may further include other devices.

The memory storage device 100 is coupled to other devices of the host system 1000 through the data transmission interface 1110. Data can be written into or be read from the memory storage device 100 through operations of the microprocessor 1102, the RAM 1104, and the I/O device 1106. For example, the memory storage device 100 may be a rewritable non-volatile memory storage device such as a USB disk 1212, a memory card 1214, or a solid state drive (SSD) 1216 as shown in FIG. 8.

Generally, the host system 1000 may be any system that substantially coordinates with the memory storage device 100 in order to store data. Even though the host system 1000 is described as a computer system in the present exemplary embodiment, the host system 1000 in another exemplary embodiment of the disclosure may be a system such as a digital camera, a video camera, a telecommunication device, an audio player, or a video player. For example, if the host system 1000 is a digital camera (video camera) 1310, then the rewritable non-volatile memory storage device is a SD card 1312, a MMC card 1314, a memory stick 1316, a CF card 1318, or an embedded storage device 1320 (as shown in FIG. 9) which is used in the digital camera 1310. The embedded storage device 1320 includes an embedded MMC (eMMC). It should be mentioned that the eMMC is directly coupled to a substrate of the host system.

Figure 10:
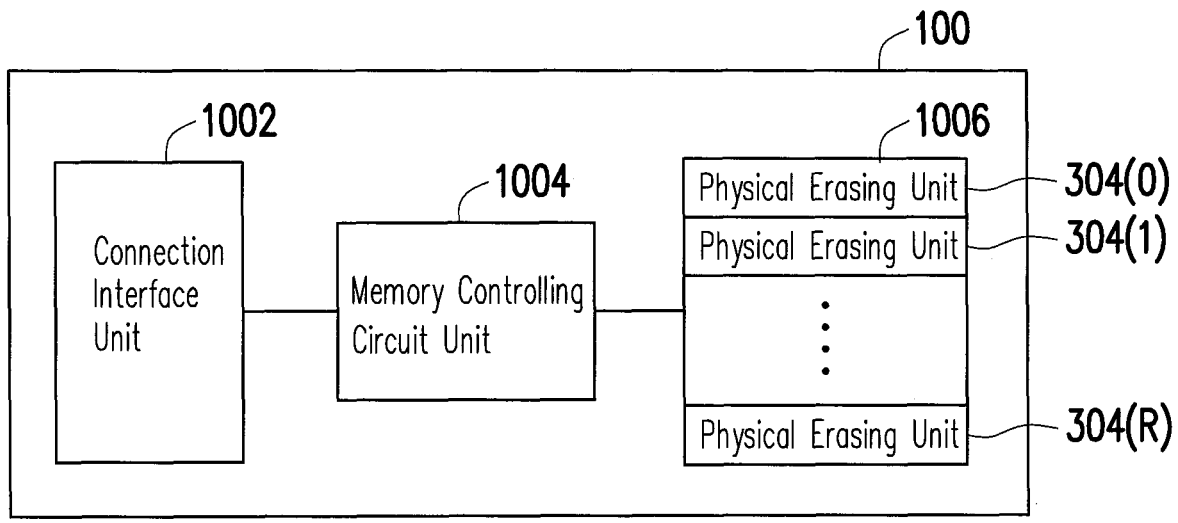
FIG. 10 is a schematic block diagram illustrating a memory storage device depicted in FIG. 7.

FIG. 10 is a schematic block diagram illustrating a memory storage device depicted in FIG. 7.

With reference to FIG. 10, the memory storage device 100 includes a connection interface unit 1002, a memory controlling circuit unit 1004, and a rewritable non-volatile memory module 1006.

In the present exemplary embodiment, the connection interface unit 1002 is compatible with the Serial Advanced Technology Attachment (SATA) standards. However, it has to be understood that the disclosure is not limited thereto. The connection interface unit 1002 may also be compatible with the Parallel Advanced Technology Attachment (PATA) standards, the Institute of Electrical and Electronic Engineers (IEEE) 1394 standards, the Peripheral Component Interconnect (PCI) Express standards, the Universal Serial Bus (USB) standards, the Ultra High Speed-I (UHS-I) Interface standards, the Ultra High Speed-II (UHS-II) Interface standards, the Secure Digital (SD) Interface standards, the Memory Stick (MS) Interface standards, the Multi Media Card (MMC) Interface standards, the Small-typed Compact Flash (CF) Interface standards, the Integrated Device Electronics (IDE) standards, or other suitable standards. In the present exemplary embodiment, the connection interface unit may be packaged together with the memory controlling circuit unit in a chip, or be arranged outside a chip which contains the memory controlling circuit unit.

In an exemplary embodiment, the data sampling circuit modules 10, 40, or 50 are disposed in the connection interface unit 1002, so as to receive the differential signals RXDP and RXDN from the host system 1000 and output the corresponding bit data stream BDS for the memory controlling circuit unit 1004 to use.

The memory controlling circuit unit 1004 is configured for executing a plurality of logic gates or control commands which are implemented in a hardware form or in a firmware form, and performing operations such as writing, reading, and erasing data in the rewritable non-volatile memory module 1006 according to commands of the host system 1000.

The rewritable non-volatile memory module 1006 is coupled to the memory controlling circuit unit 1004 and is configured for storing data written by the host 1000. The rewritable non-volatile memory module 1006 includes physical erasing units 304(0) to 304(R). The physical erasing units 304(0) to 304(R) may belong to the same memory die or belong to different memory dies. Each of the physical erasing units has a plurality of physical programming units. The physical programming units which belong to the same physical erasing unit may be independently written in and be synchronously erased. In the present exemplary embodiment, each of the physical erasing units is composed of 64 physical programming units. However, in other exemplary embodiments of the disclosure, each of the physical erasing units is composed of 128 or 256 physical programming units, or other arbitrary physical programming units.

More specifically, a physical programming unit is a minimum unit for programming. Namely, a physical programming unit is a minimum unit for writing data. For example, a physical programming unit is a physical page or a physical sector. If the physical programming unit is a physical page, then each of the physical programming units usually includes a data bit area and a redundancy bit area. The data bit area includes a plurality of physical sectors, which is configured to storing user data, and the redundancy bit area is configured to store system data (e.g., the error correcting code). In the present exemplary embodiment, a data bit area includes 32 physical sectors, and a size of a physical sector is 512 bytes (B). However, in other exemplary embodiments, one data bit area may also include 8, 16, or more or fewer physical sectors, but sizes and numbers of the physical sector in one data bit area are not limited in the disclosure. On the other hand, the physical erasing unit is a minimum erasing unit. Namely, each of the physical erasing units has a minimum number of memory cells which are erased altogether. For example, a physical erasing unit is a physical block.

In the present exemplary embodiment, the rewritable non-volatile memory module 1006 is a multi level cell (MLC) NAND flash memory module (i.e., a memory cell of a flash memory module stores 2 bits of data). However, the disclosure is not limited thereto. The rewritable non-volatile memory module 1006 may also be a single level cell (SLC) NAND flash memory module (i.e., a memory cell of a flash memory module stores 1 bit of data), a trinary level cell (TLC) NAMD flash memory module (i.e., a memory cell of a flash memory module stores 3 bits of data), other flash memory module, or other memory modules having the same properties.

Figure 11:
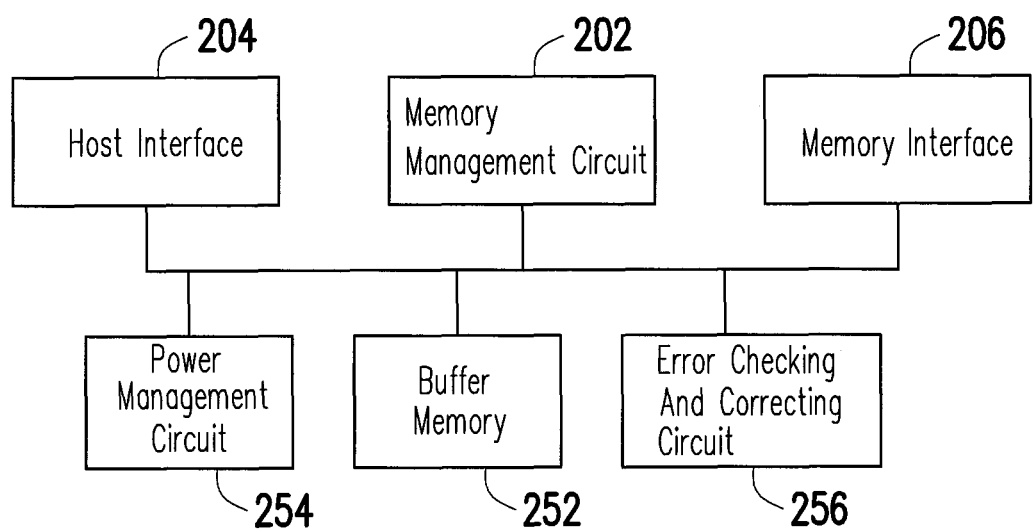
FIG. 11 is a schematic block diagram illustrating a memory controlling circuit unit according to an exemplary embodiment of the disclosure.

FIG. 11 is a schematic block diagram illustrating a memory controlling circuit unit according to an exemplary embodiment of the disclosure.

With reference to FIG. 11, the memory controlling circuit unit 1004 includes a memory management circuit 202, a host interface 204 and a memory interface 206.

The memory management circuit 202 is configured for controlling an entire operation of the memory controlling circuit unit 1004. Specifically, the memory management circuit 202 has a plurality of control commands. When the memory storage device 100 operates, the control commands are executed to perform operations such as writing in, reading, and erasing data.

In the present exemplary embodiment, the control commands of the memory management circuit 202 are implemented in a firmware form. For example, the memory management circuit 202 has a microprocessor unit (not shown) and a read-only memory (ROM) (not shown), and the control commands are programmed in the ROM. When the memory storage device 100 operates, the control commands are executed by a microprocessor unit for performing operations such as writing in, reading, and erasing data.

In another exemplary embodiment of the disclosure, the control commands of the memory management circuit 202 may also be stored as program codes in a specific area (e.g., a system area in a memory module exclusively used for storing system data) of the rewritable non-volatile memory module 1006. In addition, the memory management circuit 202 has a microprocessor unit (not shown), a read-only memory (ROM) (not shown), and a random access memory (RAM) (not shown). Particularly, the ROM has driving code segments, and when the memory controlling circuit unit 1004 is enabled, the microprocessor unit executes the driving code segments first to load the control commands which are stored in the rewritable non-volatile memory module 1006 into the RAM of the memory management circuit 202. Afterwards, the microprocessor unit runs the control commands to perform operations such as writing in, reading, and erasing data.

Moreover, in another exemplary embodiment of the disclosure, the control commands of the memory management circuit 202 may also be implemented in a hardware form. For example, the memory management circuit 202 includes a micro controller, a memory cell management circuit, a memory write-in circuit, a memory read circuit, a memory erase circuit, and a data process circuit. The memory cell management circuit, a memory write-in circuit, a memory read circuit, a memory erase circuit, and the data process circuit are coupled to the micro controller. The memory cell management circuit is configured for managing the physical erasing units of the rewritable non-volatile memory module 1006; the memory write-in circuit is configured for issuing write commands to the rewritable non-volatile memory module 1006 so as to write data into the rewritable non-volatile memory module 1006; the memory read circuit is configured for issuing read commands to the rewritable non-volatile memory module 1006 so as to read data from the rewritable non-volatile memory module 1006; the memory erase circuit is configured for issuing erase commands to the rewritable non-volatile memory module 1006 so as to erase data from the rewritable non-volatile memory module 1006; and the data process circuit is configured for processing data to be written in or read from the rewritable non-volatile memory module 1006.

The host interface 204 is coupled to the memory management circuit 202 and configured to receive and identify commands and data transmitted by the host system 1000. In other words, the commands and data transmitted by the host system 1000 are transmitted to the memory management circuit 202 through the host interface 204. In the present exemplary embodiment, the host interface 204 is compatible with the SATA standards. However, it is to be understood that the disclosure is not limited thereto. The host interface 204 may also be compatible with the PATA standards, the IEEE 1394 standards, the PCI Express standards, the USB standards, the UHS-I Interface standards, the UHS-II Interface standards, the SD standards, the MS standards, the MMC standards, the CF standards, the IDE standards, or other suitable data transmission standards.

The memory interface 206 is coupled to the memory management circuit 202 and configured for accessing the rewritable non-volatile memory module 1006. In other words, data to be written in the rewritable non-volatile memory module 1006 is converted through the memory interface 206 into a format which is acceptable to the rewritable non-volatile memory module 1006. Specifically, when the memory management circuit 202 accesses to the rewritable non-volatile memory module 1006, the memory interface 206 transmits corresponding command sequences. The command sequences may include one or more signals, or data on a bus. For example, read command sequences include information such as read identification codes and memory addresses.

In an exemplary embodiment, the memory controlling circuit unit 1004 further includes a buffer memory 252, a power management circuit 254, and an error checking and correcting circuit 256.

The buffer memory 252 is coupled to the memory management circuit 202 and configured to temporarily store data and commands from the host system 1000, or data from the rewritable non-volatile memory module 1006.

The power management circuit 254 is coupled to the memory management circuit 202 and configured to control power of the memory storage device 100.

The error checking and correcting circuit 256 is coupled to the memory management circuit 202 and configured to execute an error checking and correcting process to ensure accuracy of data. Specifically, when the memory management circuit 202 receives a write command from the host system 1000, the error checking and correcting circuit 256 generates a corresponding error checking and correcting code (ECC code) for data corresponding to the write command, and the memory management circuit 202 writes the data corresponding to the write command and the corresponding ECC code into the rewritable non-volatile memory module 1006. Afterwards, when reading data from the rewritable non-volatile memory module 1006, the memory management circuit 202 synchronously read the corresponding ECC code of the data, and the error checking and correcting circuit 256 executes the error checking and correcting process to the read data according to the ECC code.

It is worth to mention that, in an exemplary embodiment, if the memory controlling circuit unit 1004 or the memory storage device 100 is in an abnormal operation mode such as a sleep, a stand-by, or a low power consumption mode, the host system 1000 may send a wake-up signal to the memory storage device 100. The wake-up signal is configured to wake up the memory controlling circuit unit 1004 or the memory storage device 100 from the abnormal operation mode such as the sleep, the stand-by, or the low power consumption mode. The memory management circuit 202 may accurately identify if a signal from the host system 1000 is the wake-up signal through the data sampling circuit module 10, 40, or 50. If the memory management circuit 202 determines that the signal from the host system 1000 is the wake-up signal, then the memory management circuit 202 switches the mode of the memory controlling circuit unit 1004 or the memory storage device 100 to a normal operation mode.

In an exemplary embodiment, the data sampling circuit module 10, 40, or 50 voluntarily determines whether to activate (or controlled by the memory controlling circuit unit 1004) in response to the operation mode of the memory controlling circuit unit 1004 or the memory storage device 100. For example, when the memory controlling circuit unit 1004 or the memory storage device 100 is in the abnormal operation mode such as the sleep, the stand-by, or the low power consumption mode, the data sampling circuit module 10, 40, or 50 is activated; and when the memory controlling circuit unit 1004 or the memory storage device 100 is in the normal operation mode, the data sampling circuit modules 10, 40, or 50 is not activated. However, in another exemplary embodiment, the data sampling circuit module 10, 40, or 50 is always activated. For example, the data sampling circuit module 10, 40, or 50 is activated in response to power up or turn on of the memory controlling circuit unit 100, until power of the memory controlling circuit unit 100 is cut off or turned off.

In view of the above, after the received differential signal is converted into an input data stream, the disclosure may sample a clock signal according to a plurality of turning points of the input data stream and generate a bit data stream corresponding to the input data stream according to the sampled sampling signal. Accordingly, clock frequency of a clock signal used in the disclosure may be reduced, and efficiency of processing the received differential signal may also be improved.

The previously described exemplary embodiments of the present disclosure have the advantages aforementioned, wherein the advantages aforementioned not required in all versions of the disclosure.

Although the disclosure has been disclosed with reference to the aforesaid embodiments, they are not intended to limit the disclosure. It will be apparent to those skilled in the art that various modifications and variations can be made to the structure of the disclosed embodiments without departing from the scope or spirit of the disclosure. In view of the foregoing, it is intended that the disclosure cover modifications and variations of the specification provided they fall within the scope of the following claims and their equivalents.

What is claimed is:

1. A data sampling circuit module, comprising:
   a differential signal converting circuit, configured to receive a differential signal and generate an input data stream according to the differential signal;
   a sampling circuit, coupled to the differential signal converting circuit, wherein the sampling circuit is configured to sample a clock signal according to a plurality of turning points of the input data stream and output a sampling signal in response to a sampling result; and
   a bit data outputting circuit, coupled to the sampling circuit and configured to output a bit data stream corresponding to the input data stream according to the sampling signal,
   wherein the plurality of turning points are used together to sample the clock signal, and the sampling signal reflects a bit value of a single bit of the bit data stream, wherein the bit value reflects a bit data transmitted from a host system.

2. The data sampling circuit module as claimed in claim 1, wherein the plurality of turning points belong to a same clock cycle, the plurality of turning points comprise a first turning point, a second turning point and a third turning point, the first turning point and the third turning point belong to one of a raising edge and a failing edge, and the second turning point belongs to the other one of the raising edge and the failing edge.

3. The data sampling circuit module as claimed in claim 2, wherein the bit data outputting circuit comprises:
   at least a computing circuit, configured to obtain a relationship of the plurality of turning points according to the sampling signal; and
   a comparing circuit, coupled to the at least one computing circuit and configured to determine a bit data according to the relationship of the plurality of turning points.

4. The data sampling circuit module as claimed in claim 3, wherein the bit data outputting circuit further comprises:
   an outputting circuit, coupled to the differential signal converting circuit and the comparing circuit and configured to output the bit data stream according to the input data stream and the bit data.

5. The data sampling circuit module as claimed in claim 3, wherein the at least one computing circuit comprises a first computing circuit, the first computing circuit is configured to calculate a first time difference of the first turning point and the second turning point according to the sampling signal, wherein the comparing circuit is configured to compare the first time difference and a threshold value and determine the bit data according to a comparison result.

6. The data sampling circuit module as claimed in claim 5, wherein the at least one computing circuit further comprises a second computing circuit,
wherein the second computing circuit is configured to calculate a second time difference of the first turning point and the third turning point according to the sampling signal.

7. The data sampling circuit module as claimed in claim 6, wherein the operation of the comparing circuit comparing the first time difference and the threshold value and determining the bit data according to the comparison result comprises:
determining whether the first time difference is greater than half of the second time difference;
outputting a first bit data if the first time difference is greater than the half of the second time difference; and
outputting a second bit data if the first time difference is not greater than the half of the second time difference.

8. The data sampling circuit module as claimed in claim 5, wherein the at least one computing circuit further comprises a third computing circuit,
wherein the third computing circuit is configured to calculate a third time difference of the second turning point and the third turning point according to the sampling signal.

9. The data sampling circuit module as claimed in claim 8, wherein the operation of the comparing circuit comparing the first time difference and the threshold value and determining the bit data according to the comparison result comprises:
determining whether the first time difference is greater than the third time difference;
outputting a first bit data if the first time difference is greater than the third time difference; and
outputting a second bit data if the first time difference is not greater than the third time difference.

10. The data sampling circuit module as claimed in claim 2, wherein the sampling circuit comprises:
a first sampling circuit, configured to sample the clock signal according to the first turning point and output a first sampling data;
a second sampling circuit, configured to sample the clock signal according to the second turning point and output a second sampling data; and
a third sampling circuit, configured to sample the clock signal according to the third turning point and output a third sampling data.

11. The data sampling circuit module as claimed in claim 10, wherein each of the first sampling circuit, the second sampling circuit and the third sampling circuit comprises a D-type flip-flop.

12. A data sampling method, comprising:
receiving a differential signal and generating an input data stream according to the differential signal;
sampling a clock signal according to a plurality of turning points of the input data stream and outputting a sampling signal in response to a sampling result; and
outputting a bit data stream corresponding to the input data stream according to the sampling signal,
wherein the plurality of turning points are used together to sample the clock signal, and the sampling signal reflects a bit value of a single bit of the bit data stream, wherein the bit value reflects a bit data transmitted from a host system.

13. The data sampling method as claimed in claim 12, wherein the plurality of turning points belong to a same clock cycle, the plurality of turning points comprise a first turning point, a second turning point and a third turning point, the first turning point and the third turning point belong to one of a raising edge and a failing edge, and the second turning point belongs to the other one of the raising edge and the failing edge.

14. The data sampling method as claimed in claim 13, wherein the step of outputting the bit data stream corresponding to the input data stream according to the sampling signal comprise:
obtaining a relationship of the plurality of turning points according to the sampling signal; and
determining a bit data according to the relationship of the plurality of turning points.

15. The data sampling method as claimed in claim 14, wherein the step of outputting the bit data stream corresponding to the input data stream according to the sampling signal further comprise:
outputting the bit data stream according to the input data stream and the bit data.

16. The data sampling method as claimed in claim 14, wherein the step of obtaining the relationship of the plurality of the plurality of turning points according to the sampling signal comprises:
calculating a first time difference of the first turning point and the second turning point according to the sampling signal,
wherein the step of determining the bit data according to the relationship of the plurality of turning points comprises:
comparing the first time difference and a threshold value and determining the bit data according to a comparison result.

17. The data sampling method as claimed in claim 16, wherein the step of obtaining the relationship of the plurality of the plurality of turning points according to the sampling signal further comprises:
calculating a second time difference of the first turning point and the third turning point according to the sampling signal.

18. The data sampling method as claimed in claim 17, wherein the step of comparing the first time difference and the threshold value and determining the bit data according to the comparison result comprises:
determining whether the first time difference is greater than half of the second time difference;
outputting a first bit data if the first time difference is greater than the half of the second time difference; and
outputting a second bit data if the first time difference is not greater than the half of the second time difference.

19. The data sampling method as claimed in claim 16, wherein the step of obtaining the relationship of the plurality of the plurality of turning points according to the sampling signal further comprises:
calculating a third time difference of the second turning point and the third turning point according to the sampling signal.

20. The data sampling method as claimed in claim 19, wherein the step of comparing the first time difference and the threshold value and determining the bit data according to the comparison result comprises:
determining whether the first time difference is greater than the third time difference;
outputting a first bit data if the first time difference is greater than the third time difference; and outputting a second bit data if the first time difference is not greater than the third time difference.

21. The data sampling method as claimed in claim 13, wherein the step of sampling the clock signal according to the plurality of turning points of the input data stream and outputting the sampling signal comprises:
sampling the clock signal according to the first turning point and outputting a first sampling data;
sampling the clock signal according to the second turning point and outputting a second sampling data; and
sampling the clock signal according to the third turning point and outputting a third sampling data.

22. A memory storage device, comprising:
a connection interface unit, configured to couple to a host system;
a rewritable non-volatile memory module, comprising a plurality of physical erasing units; and
a memory controlling circuit unit, coupled to the connection interface unit and the rewritable non-volatile memory module, wherein the connection interface unit comprises a data sampling circuit module, and the data sampling circuit module comprises:
a differential signal converting circuit, configured to receive a differential signal and generating an input data stream according to the differential signal;
a sampling circuit, coupled to the differential signal converting circuit, wherein the sampling circuit is configured to sample a clock signal by using a plurality of turning points of the input data stream and output a sampling signal in response to a sampling result; and
a bit data outputting circuit, coupled to the sampling circuit and configured to output a bit data stream corresponding to the input data stream according to the sampling signal,
wherein the plurality of turning points are used together to sample the clock signal, and the sampling signal reflects a bit value of a single bit of the bit data stream, wherein the bit value reflects a bit data transmitted from the host system.

23. The memory storage device as claimed in claim 22, wherein the plurality of turning points belong to a same clock cycle, the plurality of turning points comprise a first turning point, a second turning point and a third turning point, the first turning point and the third turning point belong to one of a raising edge and a failing edge, and the second turning point belongs to the other one of the raising edge and the failing edge.

24. The memory storage device as claimed in claim 23, wherein the bit data outputting circuit comprises:
at least a computing circuit, configured to obtain a relationship of the plurality of turning points according to the sampling signal; and
a comparing circuit, coupled to the at least one computing circuit and configured to determine a bit data according to the relationship of the plurality of turning points.

25. The memory storage device as claimed in claim 24, wherein the bit data outputting circuit further comprises:
an outputting circuit, coupled to the differential signal converting circuit and the comparing circuit and configured to output the bit data stream according to the input data stream and the bit data.

26. The memory storage device as claimed in claim 24, wherein the at least one computing circuit comprises a first computing circuit, the first computing circuit is configured to calculate a first time difference of the first turning point and the second turning point according to the sampling signal,
wherein the comparing circuit is configured to compare the first time difference and a threshold value and determine the bit data according to a comparison result.

27. The memory storage device as claimed in claim 26, wherein the at least one computing circuit further comprises a second computing circuit,
wherein the second computing circuit is configured to calculate a second time difference of the first turning point and the third turning point according to the sampling signal.

28. The memory storage device as claimed in claim 27, wherein the operation of the comparing circuit comparing the first time difference and the threshold value and determining the bit data according to the comparison result comprises:
determining whether the first time difference is greater than half of the second time difference;
outputting a first bit data if the first time difference is greater than the half of the second time difference; and
outputting a second bit data if the first time difference is not greater than the half of the second time difference.

29. The memory storage device as claimed in claim 26, wherein the at least one computing circuit further comprises a third computing circuit,
wherein the third computing circuit is configured to calculate a third time difference of the second turning point and the third turning point according to the sampling signal.

30. The memory storage device as claimed in claim 29, wherein the operation of the comparing circuit comparing the first time difference and the threshold value and determining the bit data according to the comparison result comprises:
determining whether the first time difference is greater than the third time difference;
outputting a first bit data if the first time difference is greater than the third time difference; and
outputting a second bit data if the first time difference is not greater than the third time difference.

31. The memory storage device as claimed in claim 23, wherein the sampling circuit comprises:
a first sampling circuit, configured to sample the clock signal according to the first turning point and output a first sampling data;
a second sampling circuit, configured to sample the clock signal according to the second turning point and output a second sampling data; and
a third sampling circuit, configured to sample the clock signal according to the third turning point and output a third sampling data.

32. The memory storage device as claimed in claim 31, wherein each of the first sampling circuit, the second sampling circuit and the third sampling circuit comprises a D-type flip-flop.

* * * * *